(12) United States Patent
Haase et al.

(10) Patent No.: US 10,510,836 B1
(45) Date of Patent: Dec. 17, 2019

(54) GATE TRENCH DEVICE WITH OXYGEN INSERTED SI-LAYERS

(71) Applicant: Infineon Technologies Austria AG, Villach (AT)

(72) Inventors: Robert Haase, San Pedro, CA (US); Martin Poelzl, Ossiach (AT); Maximilian Roesch, St. Magdalen (AT); Sylvain Leomant, Poertschach am Woerthersee (AT); Andreas Meiser, Sauerlach (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/058,544

(22) Filed: Aug. 8, 2018

(51) Int. Cl.
| | | |
|---|---|---|
| *H01L 29/76* | (2006.01) | |
| *H01L 29/06* | (2006.01) | |
| *H01L 29/78* | (2006.01) | |
| *H01L 29/417* | (2006.01) | |
| *H01L 29/10* | (2006.01) | |
| *H01L 21/225* | (2006.01) | |
| *H01L 29/40* | (2006.01) | |

(Continued)

(52) U.S. Cl.
CPC ...... *H01L 29/0653* (2013.01); *H01L 21/2253* (2013.01); *H01L 29/0865* (2013.01); *H01L 29/1095* (2013.01); *H01L 29/407* (2013.01); *H01L 29/41741* (2013.01); *H01L 29/66727* (2013.01); *H01L 29/66734* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 6,404,007 B1 * | 6/2002 | Mo | H01L 21/28202 |
| | | | 257/324 |
| 7,858,478 B2 | 12/2010 | Hirler | |

(Continued)

OTHER PUBLICATIONS

Datta, Suman, "Mitigation of Intrinsic VT Variation using Oxygen Inserted (OI) Silicon Channel", University of Notre Dame, IEEE IEDM conference in San Francisco, CA, USA, Dec. 2017, accessed online at http://blog.atomera.com/wp-content/uploads/2017/12/2017-IEDM-Seminar-Suman-20171204.pdf on Aug. 8, 2018, pp. 1-20.

(Continued)

*Primary Examiner* — Hung K Vu
(74) *Attorney, Agent, or Firm* — Murphy, Bilak & Homiller, PLLC (57) ABSTRACT

A semiconductor device includes a gate trench extending into a Si substrate, the gate trench including a gate electrode and a gate dielectric separating the gate electrode from the Si substrate. The semiconductor device further includes a body region in the Si substrate adjacent the gate trench, the body region including a channel region which extends along a sidewall of the gate trench, a source region in the Si substrate above the body region, a contact trench extending into the Si substrate and filled with an electrically conductive material which contacts the source region and a highly doped body contact region at a bottom of the contact trench, and a diffusion barrier structure extending along at least part of the channel region and disposed between the channel region and the highly doped body contact region. The diffusion barrier structure includes alternating layers of Si and oxygen-doped Si.

20 Claims, 11 Drawing Sheets

(51) Int. Cl.
  *H01L 29/66* (2006.01)
  *H01L 29/08* (2006.01)

(56) References Cited

U.S. PATENT DOCUMENTS

| | | | |
|---|---|---|---|
| 8,067,800 B2* | 11/2011 | Hsieh | H01L 29/0634 257/331 |
| 2004/0031987 A1* | 2/2004 | Henninger | H01L 29/407 257/328 |
| 2004/0166636 A1* | 8/2004 | Darwish | H01L 21/2253 438/270 |
| 2013/0168760 A1 | 7/2013 | Hsieh | |

OTHER PUBLICATIONS

Takeuchi, Hideki, et al., "Punch-Through Stop Doping Profile Control via Interstitial Trapping by Oxygen-Insertion Silicon Channel", 2017 IEEE Electron Devices Technology and Manufacturing Conference (EDTM), Feb. 28-Mar. 2, 2017, pp. 1-6.
Xu, Nuo, et al., "Extension of Planar Bulk n-Channel MOSFET Scaling With Oxygen Insertion Technology", IEEE Transactions on Electron Devices, vol. 61, No. 9, Sep. 2014, pp. 3345-3349.
Xu, N., et al., "MOSFET Performance and Scalability Enhancement by Insertion of Oxygen Layers", 2012 International Electron Devices Meeting, San Francisco, CA, USA, Dec. 2012, pp. 127-130.
Havanur, Sanjay, et al., "Power MOSFET Basics Understanding Superjunction Technology", Vishay Siliconix, Device Application Note AN849, accessed online at https://www.vishay.com/docs/66864/an849.pdf on Jul. 2, 2019, pp. 1-5.

\* cited by examiner

GATE TRENCH DEVICE WITH OXYGEN INSERTED SI-LAYERS

BACKGROUND

As the dimensions of trench-based transistors shrink, the influence of the highly-doped source/body contact on the net body doping near the channel region becomes more important. For wider lateral distribution of the source/body contact diffusion with 2-3 orders of magnitude higher doping levels compared to the body doping, Vth (threshold voltage) and RonA (on-state resistance) of the device increases. Increasing the distance between the source/body contact and the channel region causes depletion of the body at high drain voltages which can lead to high DIBL (drain-induced barrier lowering). Furthermore, the process window variation for both trench width and contact width as well as contact misalignment must become smaller to avoid these adverse effects (higher Vth, higher RonA and higher DIBL).

Hence, better control of the lateral out-diffusion of the source/body contact doping is desirable.

SUMMARY

According to an embodiment of a semiconductor device, the semiconductor device comprises: a gate trench extending into a Si substrate, the gate trench including a gate electrode and a gate dielectric separating the gate electrode from the Si substrate; a body region in the Si substrate adjacent the gate trench, the body region including a channel region which extends along a sidewall of the gate trench; a source region in the Si substrate above the body region; a contact trench extending into the Si substrate and filled with an electrically conductive material which contacts the source region and a highly doped body contact region at a bottom of the contact trench; and a diffusion barrier structure extending along at least part of the channel region and disposed between the channel region and the highly doped body contact region, the diffusion barrier structure comprising alternating layers of Si and oxygen-doped Si.

In an embodiment, the channel region, the gate electrode and the gate dielectric may extend deeper into the Si substrate than the diffusion barrier structure.

Separately or in combination, the gate trench may further include a field electrode disposed below the gate electrode and a field dielectric separating the field electrode from the gate electrode and the Si substrate, and the diffusion barrier structure may terminate before reaching the field dielectric to provide a charge carrier pathway from the channel region to a drift zone below the body region without traversing the diffusion barrier structure.

Separately or in combination, the diffusion barrier structure may extend over an upper side of the body region and may be between the source region and the body region at the upper side of the body region.

Separately or in combination, the semiconductor device may further comprise a capping layer of epitaxial Si interposed between the diffusion barrier structure and the gate dielectric, wherein the capping layer of epitaxial Si may be doped to form the channel region.

Separately or in combination, the Si substrate may comprise one or more Si epitaxial layers grown on a base Si substrate.

According to an embodiment of a method of manufacturing a semiconductor device, the method comprises: forming a gate trench which extends into a Si substrate, the gate trench including a gate electrode and a gate dielectric separating the gate electrode from the Si substrate; forming a body region in the Si substrate adjacent the gate trench, the body region including a channel region which extends along a sidewall of the gate trench; forming a source region in the Si substrate above the body region; forming a contact trench extending into the Si substrate and filled with an electrically conductive material which contacts the source region and a highly doped body contact region at a bottom of the contact trench; and forming a diffusion barrier structure which extends along at least part of the channel region and is disposed between the channel region and the highly doped body contact region, the diffusion barrier structure comprising alternating layers of Si and oxygen-doped Si.

In an embodiment, forming the diffusion barrier structure may comprise, after etching the gate trench into the Si substrate and before forming the gate electrode and the gate dielectric in the gate trench, epitaxially growing the alternating layers of Si and oxygen-doped Si on the sidewall of the gate trench.

Separately or in combination, the method may further comprise epitaxially growing the alternating layers of Si and oxygen-doped Si on a main surface of the Si substrate into which the gate trench is etched.

Separately or in combination, the alternating layers of Si and oxygen-doped Si may be epitaxially grown on the main surface of the Si substrate at the same time as on the sidewall of the gate trench.

Separately or in combination, the method may further comprise forming a capping layer of epitaxial Si between the diffusion barrier and the sidewall of the gate trench.

Separately or in combination, the method may further comprise doping the capping layer to form the channel region.

Separately or in combination, the method may further comprise: after etching the gate trench into the Si substrate and before epitaxially growing the alternating layers of Si and oxygen-doped Si, forming a field electrode and a field dielectric separating the field electrode from the Si substrate in a lower part of the gate trench; and after epitaxially growing the alternating layers of Si and oxygen-doped Si on the sidewall of the gate trench, recessing the field dielectric to expose a section of the trench sidewall which is uncovered by the diffusion barrier structure and to form a vertical gap between the field dielectric and the alternating layers of Si and oxygen-doped Si.

Separately or in combination, the method may further comprise epitaxially growing a capping layer of epitaxial Si on the alternating layers of Si and oxygen-doped Si and on the exposed section of the trench sidewall uncovered by the diffusion barrier structure, the capping layer of epitaxial Si filling the vertical gap between the field dielectric and the alternating layers of Si and oxygen-doped Si and forming the channel region.

Separately or in combination, the method may further comprises forming the gate dielectric on the capping layer of epitaxial Si.

Separately or in combination, the method may further comprise implanting dopants through the gate dielectric and into a part of the capping layer of epitaxial Si epitaxially grown on the alternating layers of Si and oxygen-doped Si, to adjust a threshold voltage of the semiconductor device.

Separately or in combination, the method may further comprise, after forming the gate dielectric, filling the gate trench above the field electrode with an electrically conductive material that forms the gate electrode.

Separately or in combination, forming the contact trench may comprise: etching the contact trench through the alternating layers of Si and oxygen-doped Si epitaxially grown on the main surface of the Si substrate, through the source region, and into the body region; implanting dopants into the bottom of the contact trench and annealing the dopants to form the highly doped body contact region at the bottom of the contact trench; and filling the contact trench with the electrically conductive material which contacts the source region and the highly doped body contact region.

Separately or in combination, forming the body region and the source region may comprise, after forming the diffusion barrier structure, implanting dopants of the opposite conductivity type into a main surface of the Si substrate into which the gate trench is etched.

Separately or in combination, the Si substrate used to manufacture the semiconductor device may comprise one or more Si epitaxial layers grown on a base Si substrate.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description which follows.

DETAILED DESCRIPTION

Embodiments described herein control lateral out-diffusion of the source/body contact doping for trench-based transistors, allowing for narrower Vth, RonA and DIBL distributions for a given geometry variation for the highly-doped source/body contact and gate trench, and/or allowing for a lateral spacing reduction between the source/body contact and channel region of the device for given Vth, RonA and DIBL windows. The lateral out-diffusion of the source/body contact doping is better controlled by inserting a diffusion barrier structure which extends along at least part of the channel region of the device. The diffusion barrier structure comprises alternating layers of Si and oxygen-doped Si disposed between the highly doped source/body contact and the channel region of the device. The oxygen-doped Si layers of the diffusion barrier structure limit the lateral out-diffusion of the source/body contact doping, thereby controlling the lateral out-diffusion of the source/body contact doping in a direction towards the channel region. The diffusion barrier structure enables, for example, narrower Vth distribution for a narrow-trench MOSFET, or for a predetermined Vth distribution width, a smaller distance between the contact trench and the gate trench. Charge carrier mobility in the channel region may be increased, e.g., by up to 80% by incorporating the diffusion barrier structure. Gate leakage may also be reduced by incorporating the diffusion barrier structure, e.g., by up to 50%, and gate reliability improved compared to gate oxides grown on conventional silicon epitaxial layers. Described next in more detail are embodiments of semiconductor devices with such a diffusion barrier structure, and corresponding methods of manufacture.

Figure 1:
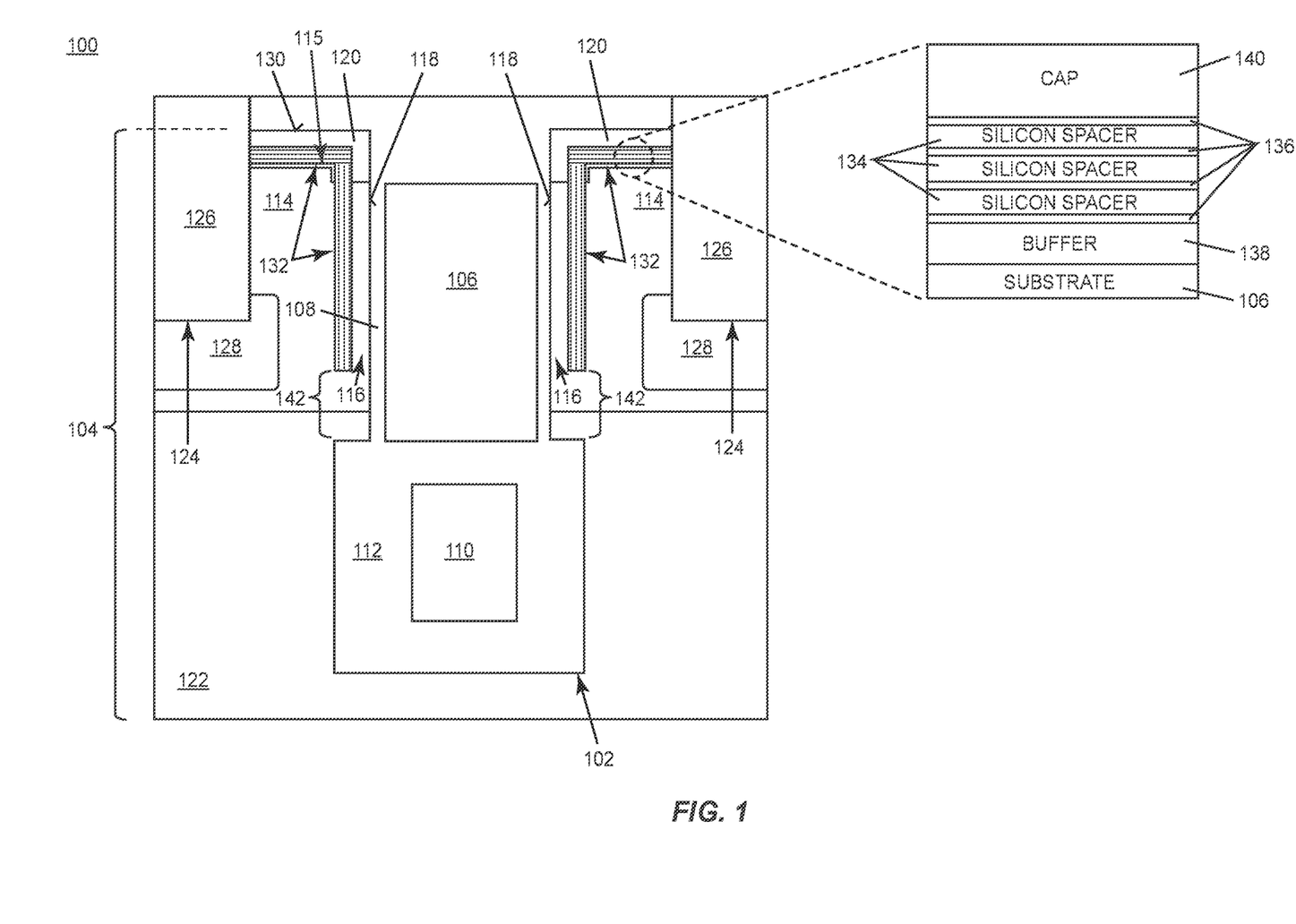
FIG. 1 illustrates a partial cross-sectional view of an embodiment of a trench-based semiconductor device having a diffusion barrier structure.

FIG. 1 illustrates a partial cross-sectional view of an embodiment of a trench-based semiconductor device 100. The semiconductor device 100 includes one or more gate trenches 102 extending into a Si substrate 104. A single gate trench 102 is shown in FIG. 1, however the semiconductor device 100 may include a plurality of gate trenches 102 with the same or similar construction but which are out of view. The Si substrate 104 may comprise one or more Si epitaxial layers grown on a base Si substrate. A gate electrode 106 disposed in each gate trench 102 is insulated from the surrounding semiconductor material by a gate dielectric 108. A field electrode 110 may be disposed in each gate trench 102 below the corresponding gate electrode 106, and insulated from the surrounding semiconductor material and the gate electrode 106 by a field dielectric 112. The gate and field dielectrics 108, 112 may comprise the same or different materials, and may have the same or different thicknesses. The field electrode 110 instead may be formed in a different trench separate from the gate trench 102, or omitted altogether depending on the type of semiconductor device. The trench-based semiconductor device 100 may be a power semiconductor device such as a power MOSFET (metal-oxide-semiconductor field effect transistor), an IGBT (insulated gate bipolar transistor), etc.

The trench-based semiconductor device 100 further includes a body region 114 formed in the Si substrate 104. The body region 114 includes a channel region 116 which vertically extends along the sidewall 118 of the corresponding gate trench 102. The semiconductor device 100 also includes a source region 120 formed in the Si substrate 104 above the body region 114. Vertical current flow through the channel region 116 is controlled by applying a gate potential to the gate electrode 106. A drain or collector region (not shown) is formed below a drift zone 122 of the device 100. Depending on the type of device, additional structures may be formed in the drift zone 122 and/or between the drift zone 122 and the drain/collector region. For example, charge compensation structures may be formed in the drift zone 122 and/or a field stop layer may be formed between the drift zone 122 and the drain/collector region in the case of an IGBT type device. Again, any type of semiconductor device with a trench gate may utilize the diffusion barrier teachings described herein.

The trench-based semiconductor device 100 further includes a contact trench 124 which extends into the Si substrate 104. The contact trench 124 is separated from each adjacent gate trench 102 by a portion of the source region 120 and a portion of the body region 114. The contact trench 124 is filled with an electrically conductive material 126 such as doped polysilicon, metal, etc. which contacts the source region 120 at the sidewall of the contact trench 124 and a highly doped body contact region 128 at the bottom of the contact trench 124.

The highly doped body contact region 128 at the bottom of the contact trench 124 has the same doping type as the body region 114, but at a higher concentration to provide good ohmic contact with the electrically conductive material 126 which fills the contact trench 124. For example, in the case of an n-channel device, the source region 120 and drift zone 122 are doped n-type and the body region 114, channel region 116 and highly doped body contact region 128 are doped p-type. Conversely, in the case of an p-channel device, the source region 120 and drift zone 122 are doped p-type and the body region 114, channel region 116 and highly doped body contact region 128 are doped n-type. In either case, the gate and contact trenches 102, 124 extend into the Si substrate 104 from the same front surface 130.

A diffusion barrier structure 132 extends along at least part of the channel region 116 and is disposed between the channel region 116 and the neighboring highly doped body contact region 128. The diffusion barrier structure 132 comprises alternating layers of Si 134 and oxygen-doped Si 136. The alternating layers of Si 134 and oxygen-doped Si 136 form an oxygen-doped silicon region grown by epitaxy. In an embodiment, the oxygen concentration for each oxygen-doped Si layer 136 is below 5e14 cm-3. Each oxygen-doped Si layer 136 may have a thickness in the atomic range (e.g. one or several atoms thick) or in the nanometer range to ensure sufficient crystal information for growing Si on the oxygen-doped Si layers 136. The alternating layers of Si 134 and oxygen-doped Si 136 may be realized by epitaxially growing Si layers alternating with oxygen layers respectively adsorbed on surfaces of the Si layers, e.g., with a particular limited thickness for the oxygen-doped Si layers 136 to ensure adequate Si growth.

FIG. 1 provides an exploded view of the diffusion barrier structure 132, which may also include a Si buffer layer 138 below the alternating layers of Si 134 and oxygen-doped Si 136, and/or a capping layer 140 of Si epitaxially grown on the alternating layers of Si 134 and oxygen-doped Si 136. The Si buffer layer 138 may be relatively thin, e.g., in the range of 2-5 nm thick. The Si buffer layer 138 may be grown after an implant or an etch step. The capping layer 140 provides high carrier mobility in this region of the device 100. One or both of the buffer layer 138 and the capping layer 140 may be omitted. The oxygen-doped Si layers 136 of the diffusion barrier structure 132 limit the lateral out-diffusion of the source/body contact doping, thereby controlling lateral out-diffusion from each highly doped body contact region 128 in a direction towards the respective channel region 116. The oxygen-doped Si layers 136 of the diffusion barrier structure 132 may also improve carrier mobility within the vertical channel region 116 of the device 100.

The oxygen-doped Si layers 136 of the diffusion barrier structure 132 may be formed by introducing oxygen partial monolayers to a Si lattice. The oxygen atoms are interstitially placed to minimize disruption to the Si lattice. Layers of Si atoms 134 separate adjacent oxygen partial monolayers 136. The alternating layers of Si 134 and oxygen-doped Si 136 may be formed by Si epitaxy with absorption of oxygen at different steps. For example, temperature and gaseous conditions can be controlled during the epitaxy process to form the partial oxygen monolayers 136. Oxygen may be introduced/incorporated between epitaxial layers 134 of Si, e.g. by controlling the introduction of an oxygen precursor into the epitaxy chamber. The resulting barrier barrier structure 132 includes monolayers 136 that comprise mainly Si but have a doped level or concentration level of oxygen alternating with standard epitaxial layers 134 of Si without oxygen. The diffusion barrier structure 132 may also comprise a capping layer 140 of Si epitaxially grown on the alternating layers of Si 134 and oxygen-doped Si 136, or the capping layer 140 of Si may be omitted. If the capping layer 140 of epitaxial Si is provided, the capping layer 140 may be doped to form the channel region 116. In addition or alternatively, the diffusion barrier structure 132 may extend over an upper side 115 of the body region 114 and be disposed between the source region 120 and the body region 114 at the upper side of the body region 114.

The channel region 116, the gate electrode 106 and the gate dielectric 108 may extend deeper into the Si substrate 104 than the diffusion barrier structure 132 to a region 142 of a charge carrier pathway from the channel region 116 to the drift zone 122 below the body region 114 which is devoid of the diffusion barrier structure 132. If a field electrode 110 is present in the gate trench 102, the diffusion barrier structure 132 may terminate before reaching the field dielectric 112 to form the region 142 of the charge carrier pathway devoid of the diffusion barrier structure 132.

Figure 2:
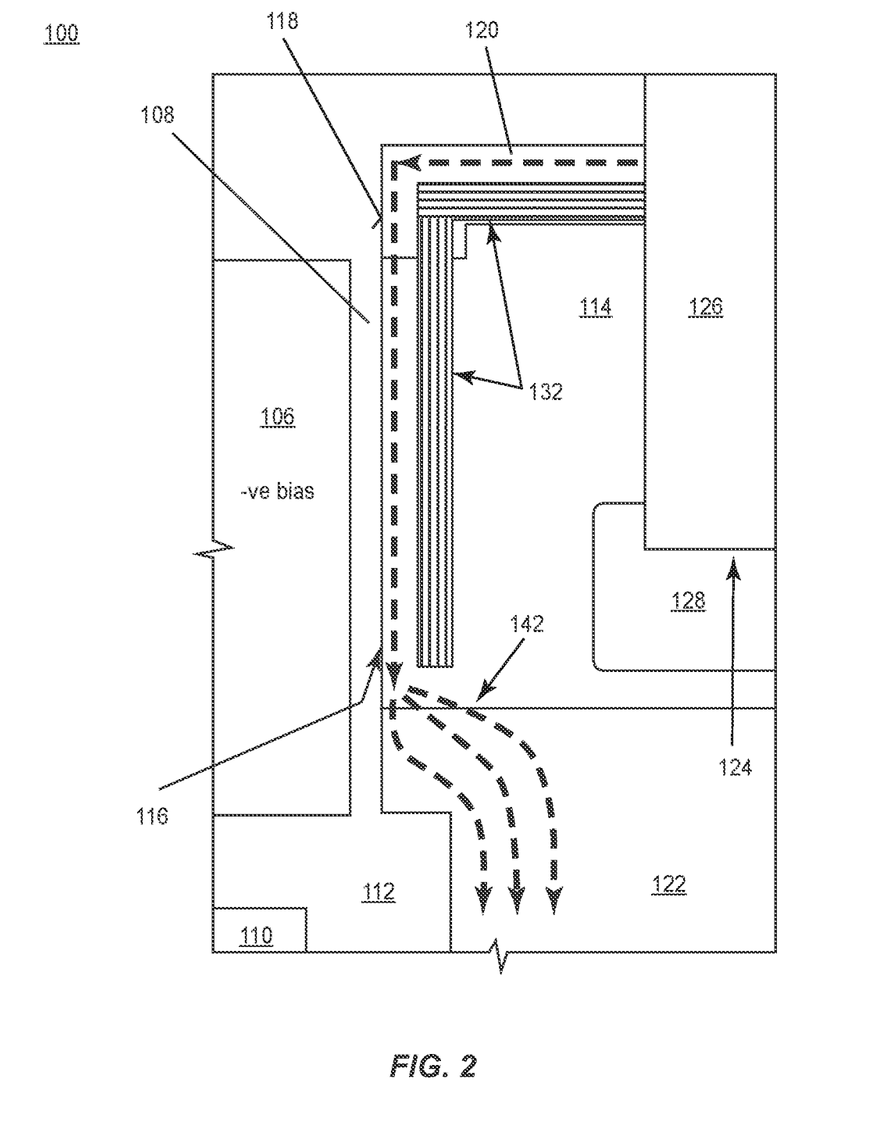
FIG. 2 is an exploded view of a region of the trench-based semiconductor device in which the diffusion barrier structure is omitted from a region of the charge carrier pathway between the channel region and the drift zone of the device.

FIG. 2 is an exploded view of a region of the trench-based semiconductor device 100 in which the diffusion barrier structure 132 is omitted from a region 142 of the charge carrier pathway between the channel region 116 and the drift zone 122. Current flows through the channel region 116 by applying a gate potential (represented by '-ve bias' in FIG. 2) to the gate electrode 106. Omitting the diffusion barrier structure 132 in a region 142 of the current pathway between the channel region 116 and the drift zone 122 allows current spreading in the drift zone 122, as indicated by the dashed lines in FIG. 2, which in turn reduces RonA (on-state resistance) of the semiconductor device 100.

FIGS. 3A through 3I illustrate respective cross-sectional views of the trench-based semiconductor device 100 shown in FIG. 1 during different stages of a manufacturing process.

Figure 3A:
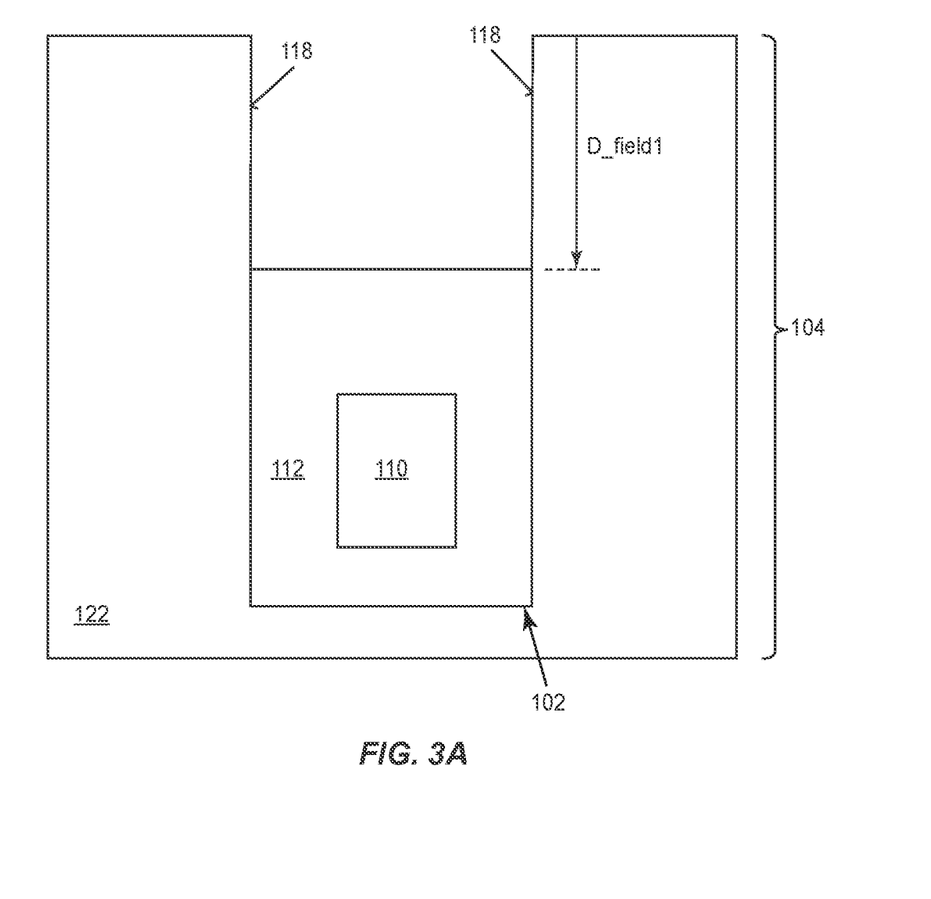
FIG. 3A through 3I illustrate respective cross-sectional views of the trench-based semiconductor device shown in FIG. 1 during different stages of a manufacturing process.

FIG. 3A shows the semiconductor device 100 after formation of the gate trenches 102. The gate trenches 102 may be etched into the Si substrate 104 using any common trench formation process such as masking and etching. A field electrode 110 may be formed in a lower part of each gate trench 102, and insulated from the surrounding semiconductor material by a field dielectric 112. The field dielectric 112 is recessed to a first depth D_field1 in the Si substrate 104.

Figure 3B:
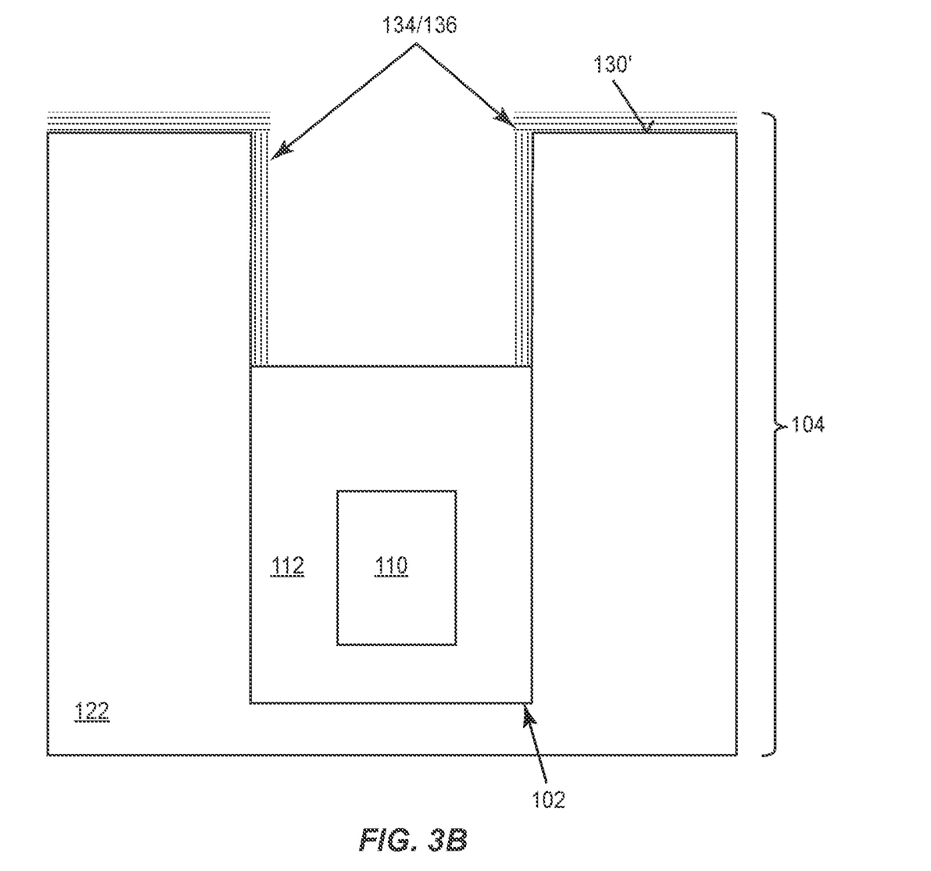

FIG. 3B shows the semiconductor device 100 after the alternating layers of Si 134 and oxygen-doped Si 136 of the diffusion barrier structure 132 are epitaxially grown on the part of the gate trench sidewall 118 uncovered by the field dielectric 112. According to this embodiment, the alternating layers of Si 134 and oxygen-doped Si 136 are epitaxially grown on the gate trench sidewall 118 after etching the gate trench 102 into the Si substrate 104 but before forming the gate electrode 106 and the gate dielectric 108 in the gate trench 102.

The alternating layers of Si 134 and oxygen-doped Si 136 may be epitaxially grown on an exposed part of the top main surface 130' of the Si substrate 104. That is, if all or part of the top main surface 130' of the Si substrate 104 is not covered by a mask or other type of insulating material during epitaxial growth of the alternating layers of Si 134 and oxygen-doped Si 136, the alternating layers of Si 134 and oxygen-doped Si 136 will also grow on the exposed part of the top main surface 130' of the Si substrate 104. In one embodiment, the alternating layers of Si 34 and oxygen-doped Si 36 are epitaxially grown on the main surface 130' of the Si substrate 104 at the same time as on the sidewall 118 of the gate trench 102. Epitaxial growth of the alternating layers of Si 134 and oxygen-doped Si 136 on the top main surface 130' of the Si substrate 104 instead may be prevented by covering the top main surface 130' with a hard mask such as an insulating layer. Reference number 130' is used in FIG. 3B to indicate the top main surface of the Si substrate 102 just prior to epitaxial growth of the alternating layers of Si 134 and oxygen-doped Si 136. Reference number 130 is used in FIG. 1 to indicate the top main surface of the Si substrate 102 after all device processing is complete, since the Si substrate may include one or more Si epitaxial layers grown on a base Si substrate, e.g. such as one or more epitaxial layers used to form the body region 114, source region 120, drift zone 122 and diffusion barrier structure 132.

Figure 3C:
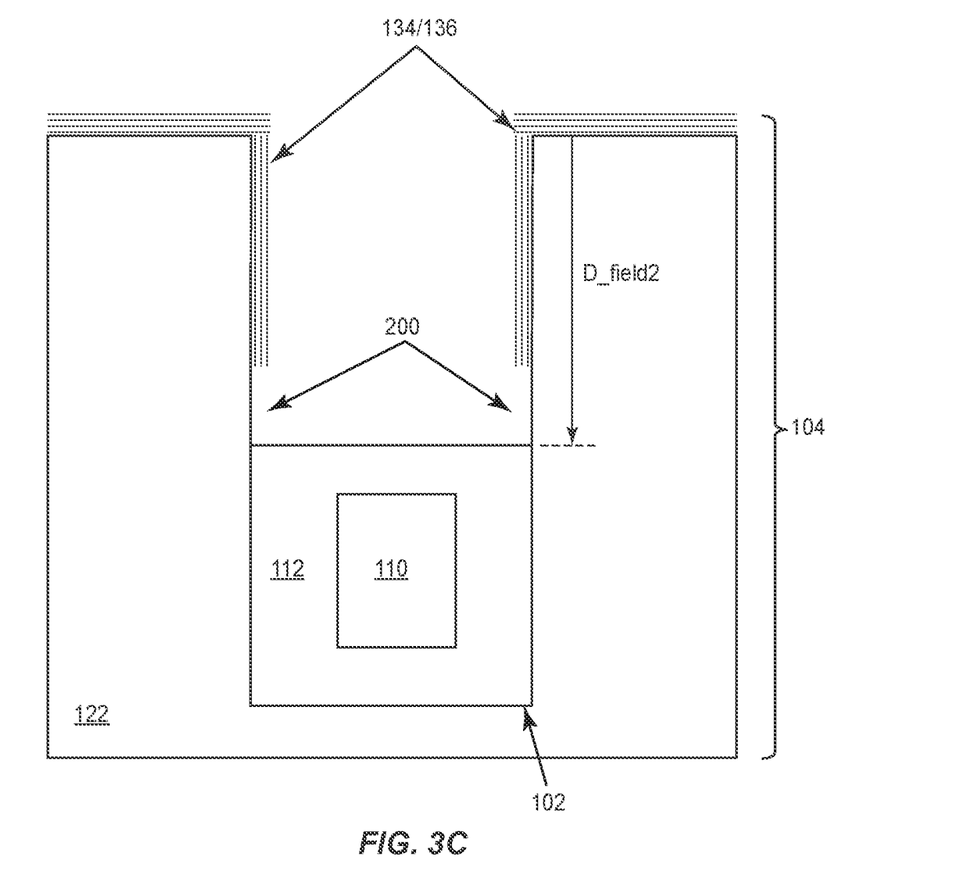

FIG. 3C shows the semiconductor device 100 after the field dielectric 112 is recessed to a second depth D_field2 in the Si substrate 104, wherein D_field 2>D_field1. Any common recessing process may be used to recess the field dielectric 112 deeper into the gate trenches 102, e.g., such as etching. Recessing the field dielectric 112 in this way exposes a section of the trench sidewall 118 which is uncovered by the alternating layers of Si 134 and oxygen-doped Si 136 of the diffusion barrier structure 132, and forms a vertical gap 200 between the field dielectric 112 and the alternating layers of Si 134 and oxygen-doped Si 136.

Figure 3D:
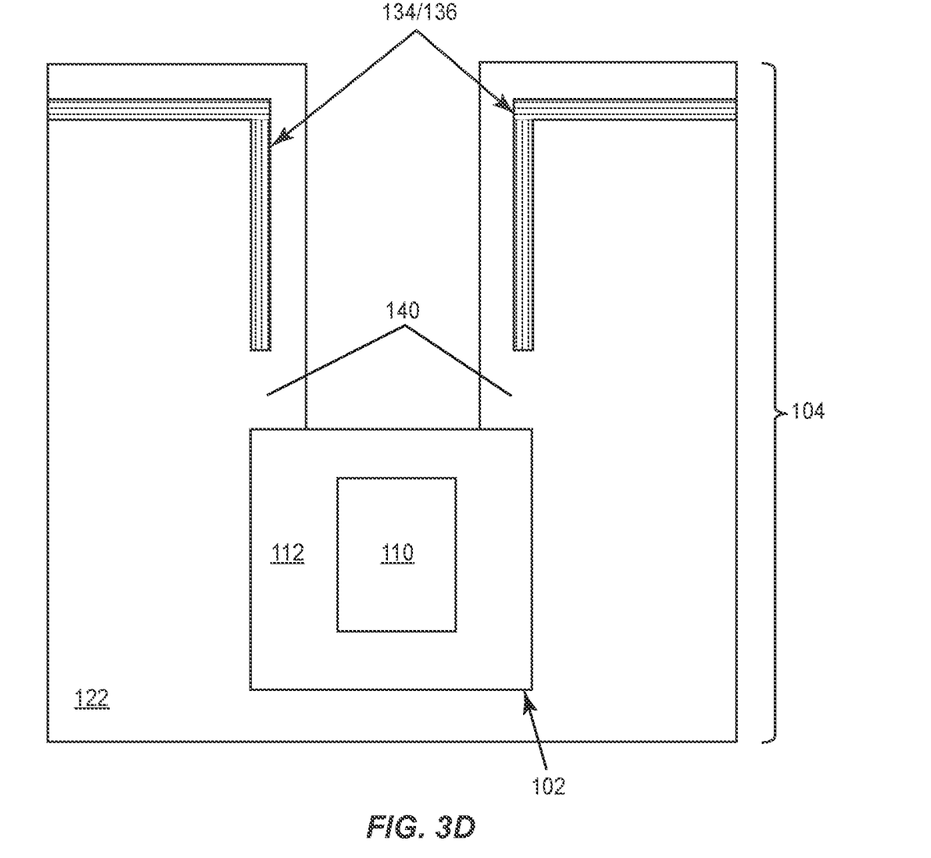

FIG. 3D shows the semiconductor device 100 after a capping layer 140 of Si is epitaxially grown on the alternating layers of Si 134 and oxygen-doped Si 136. The capping layer 140 of epitaxial Si fills the vertical gap 200 between the field dielectric 112 and the alternating layers of Si 134 and oxygen-doped Si 136, if such a vertical gap 200 is present. In one embodiment, the capping layer 140 of epitaxial Si has the same standard in situ doping concentration as the alternating layers of Si 134 and oxygen-doped Si 136 and may be doped later with a different dopant species and concentration to form the channel region 116 of the semiconductor device 100. Alternatively, the capping layer 140 may have a different in situ doping concentration compared to the alternating layers of Si 134 and oxygen-doped Si 136. In either case, the capping layer 140 may be used to implement the channel region 116 of the semiconductor device 100.

Figure 3E:
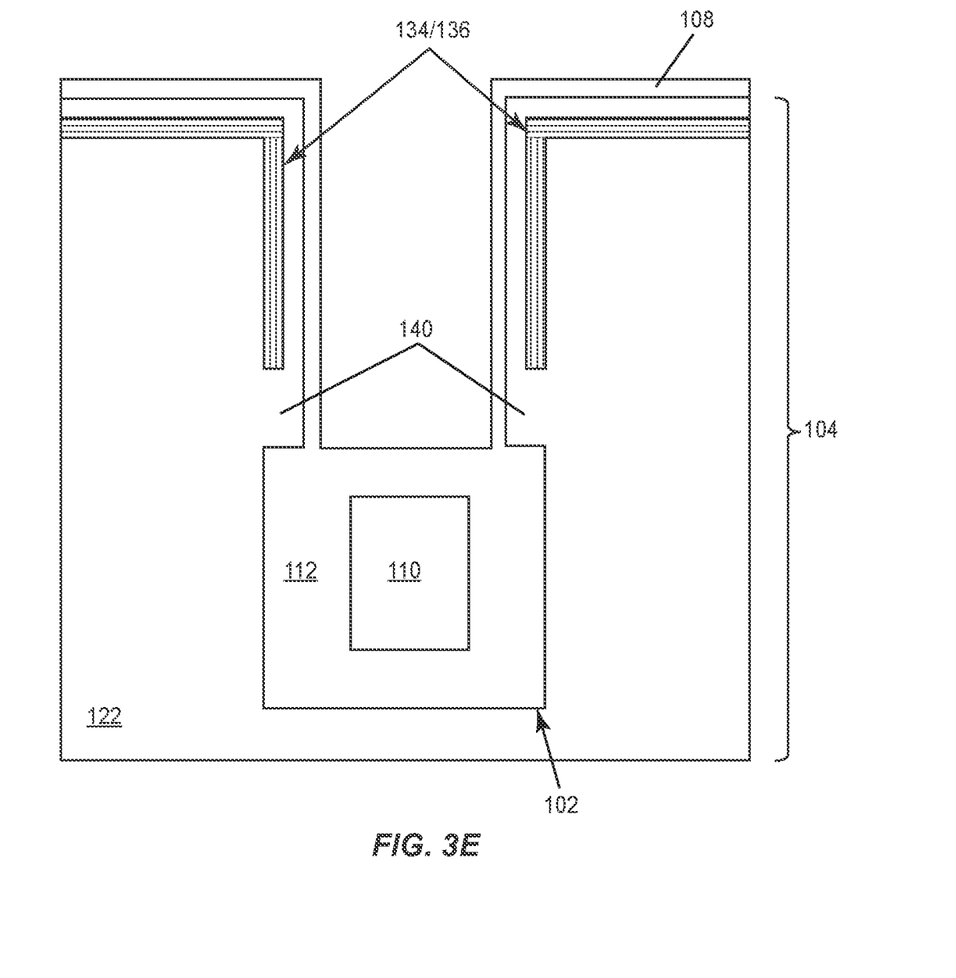

FIG. 3E shows the semiconductor device 100 after the gate dielectric 108 is formed along the diffusion barrier structure 132. Any common semiconductor manufacturing process for forming a gate dielectric may be used, e.g., such as dielectric deposition and/or thermal oxidation, etc.

Figure 3F:
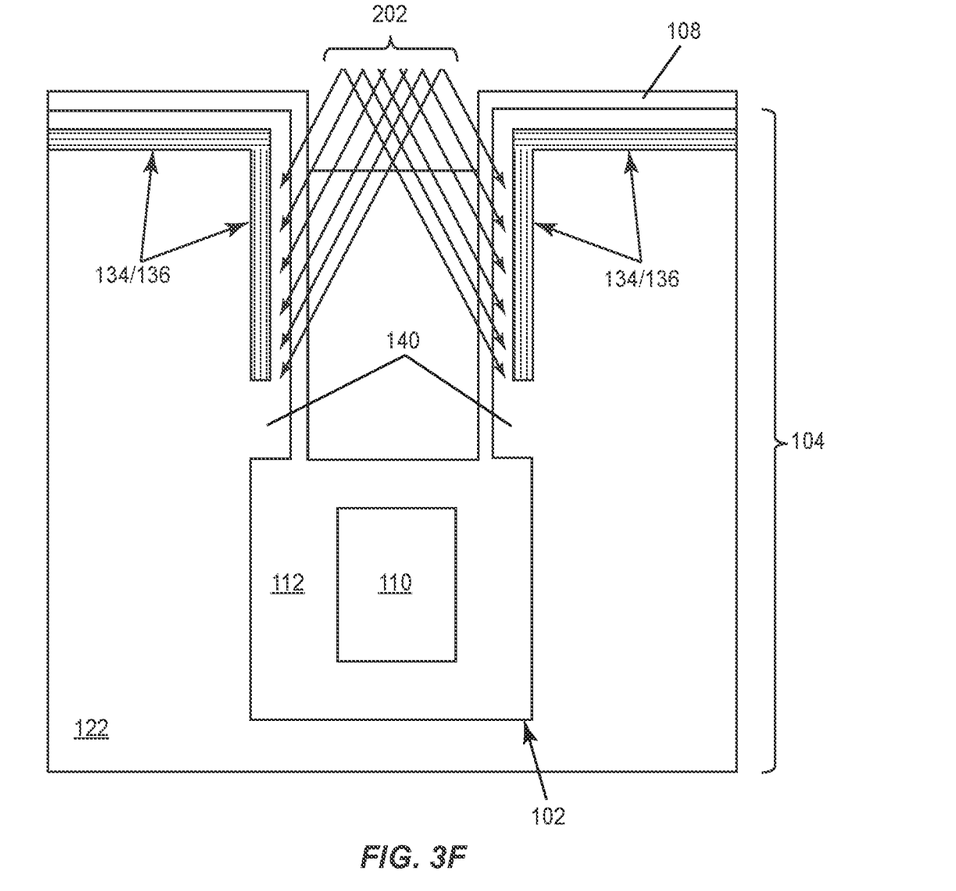

FIG. 3F shows the semiconductor device 100 during implantation of the capping layer 140 of epitaxial Si of the diffusion barrier structure 132 with dopants 202 of the same conductivity type as the body region 114, to form the channel region 116 of the device 100 along the gate trench sidewall 118. The dopants 202 are implanted through the gate dielectric 108 and into the capping layer 140 of epitaxial Si, e.g., to adjust a threshold voltage of the semiconductor device 100, e.g., if the lower part of the capping layer 140 has a different doping concentration than the remainder of the diffusion barrier structure 132 since the alternating layers of Si 134 and oxygen-doped Si 136 are not formed in the capping layer 140. The dopants 202 may be implanted into the capping layer 140 at an angle, e.g., via a quad implantation process. The dopants 202 are subsequently activated by annealing to form the channel region 116.

Figure 3G:
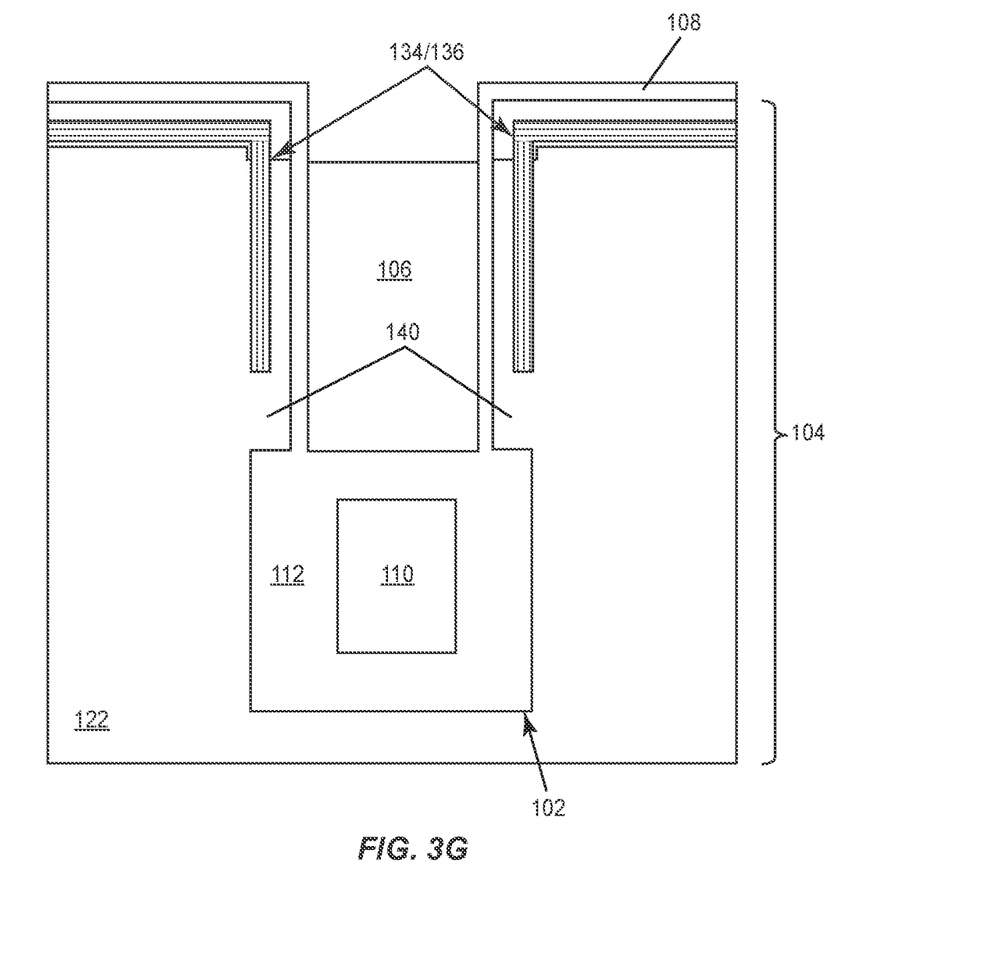

FIG. 3G shows the semiconductor device 100 after the gate trench 102 is filled with an electrically conductive material such as doped polysilicon, metal, etc. to form the gate electrode 106. For example, doped polysilicon may be deposited in the gate trench 102 and then etched back to form the gate electrode 106.

Figure 3H:
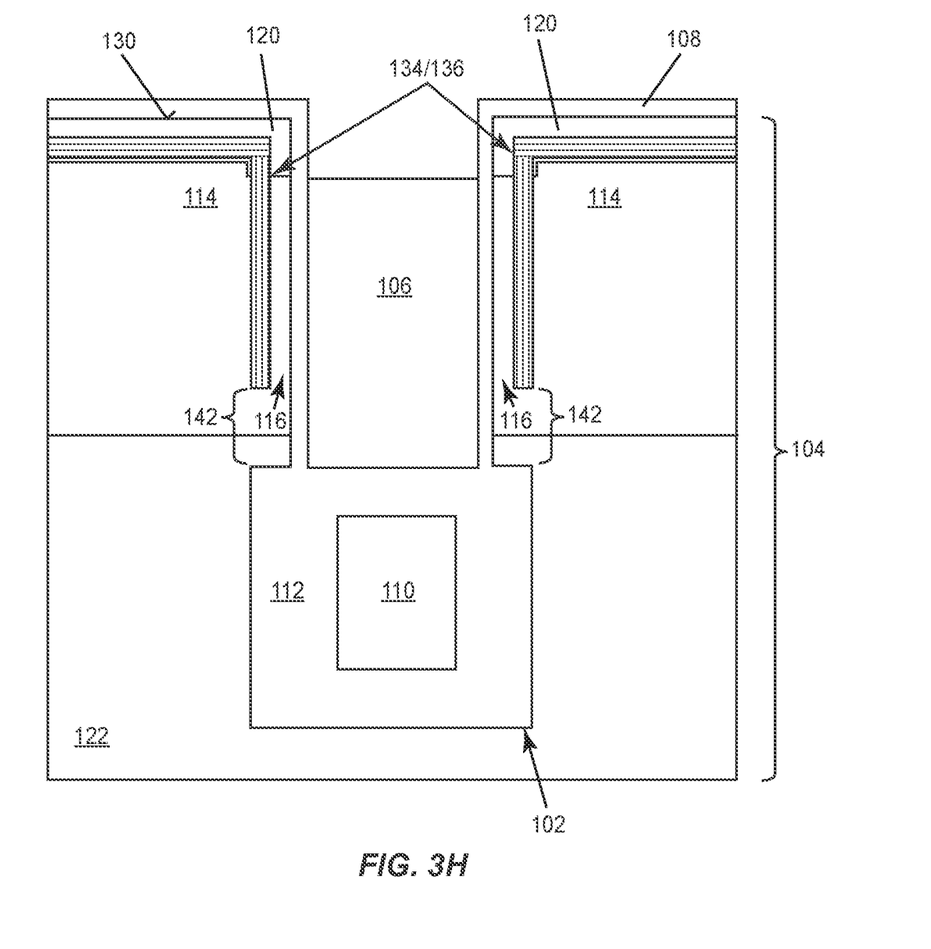

FIG. 3H shows the semiconductor device after the body and source regions 114, 120 are formed in the Si substrate 104, e.g., by dopant implantation and activation by annealing. Dopants of the opposite conductivity type are used to form the body and source regions 114, 120. The dopant species may be implanted directly into the Si substrate 104 at the front main surface 130 of the Si substrate 104 if the diffusion barrier structure 132 is not formed on this surface 130. Common doping and activation processes may be used to form the body and source regions 114, 120 of the semiconductor device.

Figure 3I:
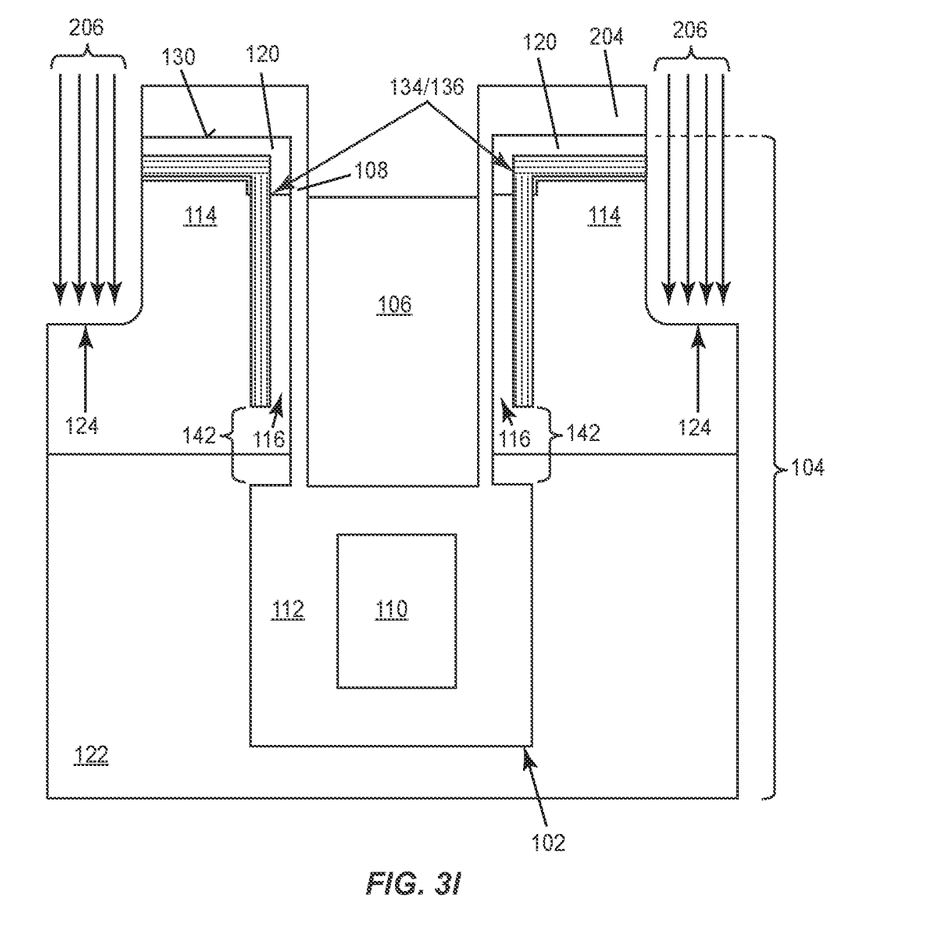

FIG. 3I shows the semiconductor device 100 after the contact trenches 124 are etched through the alternating layers of Si 134 and oxygen-doped Si 136 epitaxially grown on the main surface 130' of the Si substrate 104, through the source region 120, and into the body region 114. Any common trench etching process may be used. For example, a hard mask/insulating layer 204 such as silicon oxide may be formed over the front main surface 130 of the Si substrate 104 and patterned to form an opening. The hard mask 204 may be etched back to widen the opening in the mask 204 so that the opening is wider than the contact trench 124. In either case, the exposed part of the Si substrate 104 may then be isotropically etched to form the contact trench 124.

FIG. 3I also shows the semiconductor device 100 during implantation of the lower part of the contact trench 124 with dopants 206 of the same conductivity type as the body region 114, to provide good ohmic contact between the body region 114 and the electrically conductive material 126 subsequently deposited in the contact trench 124. Activation of the implanted dopants 206 by annealing forms a highly doped body contact region 128 at the bottom of each contact trench 124 with the same doping type as the body region 114, but at a higher concentration to provide good ohmic contact with the electrically conductive material 126 subsequently deposited in the contact trench 124. Each contact trench 124 is filled with an electrically conductive material 126 which contacts the source region 120 at the sidewall of the contact trench 124 and the highly doped body contact region 128 at the bottom of the contact trench 124, e.g., as shown in FIG. 1.

The oxygen-doped Si layers 136 of the diffusion barrier structure 132 limit the lateral out-diffusion of the source/body contact doping, thereby controlling lateral out-diffusion from each highly doped body contact region 128 in a direction towards the channel region 116. As described above in connection with FIG. 2, omitting the diffusion barrier structure 132 in a region 142 of the current pathway between the channel region 116 and the drift zone 122 allows current spreading in the drift zone 122 which in turn reduces RonA of the semiconductor device 100. The diffusion barrier structure 132 may be omitted in a region 142 of the current pathway between the channel region 116 and the drift zone 122 by recessing the field dielectric 112 deeper in the gate trench 102 after the alternating layers of Si 134 and oxygen-doped Si 136 of the diffusion barrier structure 132 are formed, e.g., as shown in FIG. 3C.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a gate trench extending into a Si substrate, the gate trench including a gate electrode and a gate dielectric separating the gate electrode from the Si substrate;
a body region in the Si substrate adjacent the gate trench, the body region including a channel region which extends along a sidewall of the gate trench;
a source region in the Si substrate above the body region;
a contact trench extending into the Si substrate and filled with an electrically conductive material which contacts the source region and a highly doped body contact region at a bottom of the contact trench; and
a diffusion barrier structure extending along at least part of the channel region and disposed between the channel region and the highly doped body contact region, the diffusion barrier structure comprising alternating layers of Si and oxygen-doped Si.

2. The semiconductor device of claim 1, wherein the channel region, the gate electrode and the gate dielectric extend deeper into the Si substrate than the diffusion barrier structure.

3. The semiconductor device of claim 1, wherein the gate trench further includes a field electrode disposed below the gate electrode and a field dielectric separating the field electrode from the gate electrode and the Si substrate, and wherein the diffusion barrier structure terminates before reaching the field dielectric to provide a charge carrier pathway from the channel region to a drift zone below the body region without traversing the diffusion barrier structure.

4. The semiconductor device of claim 1, wherein the diffusion barrier structure extends over an upper side of the body region and is between the source region and the body region at the upper side of the body region.

5. The semiconductor device of claim 1, further comprising a capping layer of epitaxial Si interposed between the diffusion barrier structure and the gate dielectric, wherein the capping layer of epitaxial Si is doped to form the channel region.

6. The semiconductor device of claim 1, wherein the Si substrate comprises one or more Si epitaxial layers grown on a base Si substrate.

7. A method of manufacturing a semiconductor device, the method comprising:
forming a gate trench which extends into a Si substrate, the gate trench including a gate electrode and a gate dielectric separating the gate electrode from the Si substrate;
forming a body region in the Si substrate adjacent the gate trench, the body region including a channel region which extends along a sidewall of the gate trench;
forming a source region in the Si substrate above the body region;
forming a contact trench extending into the Si substrate and filled with an electrically conductive material which contacts the source region and a highly doped body contact region at a bottom of the contact trench; and
forming a diffusion barrier structure which extends along at least part of the channel region and is disposed between the channel region and the highly doped body contact region, the diffusion barrier structure comprising alternating layers of Si and oxygen-doped Si.

8. The method of claim 7, wherein forming the diffusion barrier structure comprises:
after etching the gate trench into the Si substrate and before forming the gate electrode and the gate dielectric in the gate trench, epitaxially growing the alternating layers of Si and oxygen-doped Si on the sidewall of the gate trench.

9. The method of claim 8, further comprising:
epitaxially growing the alternating layers of Si and oxygen-doped Si on a main surface of the Si substrate into which the gate trench is etched.

10. The method of claim 9, wherein the alternating layers of Si and oxygen-doped Si are epitaxially grown on the main surface of the Si substrate at the same time as on the sidewall of the gate trench.

11. The method of claim 9, wherein forming the contact trench comprises:
etching the contact trench through the alternating layers of Si and oxygen-doped Si epitaxially grown on the main surface of the Si substrate, through the source region, and into the body region;
implanting dopants into the bottom of the contact trench and annealing the dopants to form the highly doped body contact region at the bottom of the contact trench; and
filling the contact trench with the electrically conductive material which contacts the source region and the highly doped body contact region.

12. The method of claim 8, further comprising:
forming a capping layer of epitaxial Si between the diffusion barrier and the sidewall of the gate trench.

13. The method of claim 12, further comprising:
doping the capping layer to form the channel region.

14. The method of claim 8, further comprising:
after etching the gate trench into the Si substrate and before epitaxially growing the alternating layers of Si and oxygen-doped Si, forming a field electrode and a field dielectric separating the field electrode from the Si substrate in a lower part of the gate trench; and
after epitaxially growing the alternating layers of Si and oxygen-doped Si on the sidewall of the gate trench, recessing the field dielectric to expose a section of the trench sidewall which is uncovered by the diffusion barrier structure and to form a vertical gap between the field dielectric and the alternating layers of Si and oxygen-doped Si.

15. The method of claim 14, further comprising:
epitaxially growing a capping layer of epitaxial Si on the alternating layers of Si and oxygen-doped Si and on the exposed section of the trench sidewall uncovered by the diffusion barrier structure, the capping layer of epitaxial Si filling the vertical gap between the field dielectric and the alternating layers of Si and oxygen-doped Si and forming the channel region.

16. The method of claim 15, further comprising:
forming the gate dielectric on the capping layer of epitaxial Si.

17. The method of claim 16, further comprising:
   implanting dopants through the gate dielectric and into a part of the capping layer of epitaxial Si epitaxially grown on the alternating layers of Si and oxygen-doped Si, to adjust a threshold voltage of the semiconductor device.

18. The method of claim 16, further comprising:
   after forming the gate dielectric, filling the gate trench above the field electrode with an electrically conductive material that forms the gate electrode.

19. The method of claim 7, wherein forming the body region and the source region comprises:
   after forming the diffusion barrier structure, implanting dopants of the opposite conductivity type into a main surface of the Si substrate into which the gate trench is etched.

20. The method of claim 7, wherein the Si substrate comprises one or more Si epitaxial layers grown on a base Si substrate.

* * * * *